United States Patent
Howard et al.

(10) Patent No.: US 6,680,504 B2
(45) Date of Patent: Jan. 20, 2004

(54) METHOD FOR CONSTRUCTING A METAL OXIDE SEMICONDUCTOR FIELD EFFECT TRANSISTOR

(75) Inventors: Gregory E. Howard, Dallas, TX (US); Jeffrey Babcock, Freising (DE); Angelo Pinto, Munich (DE)

(73) Assignee: Texas Instruments Incorporated, Dallas, TX (US)

( * ) Notice: Subject to any disclaimer, the term of this patent is extended or adjusted under 35 U.S.C. 154(b) by 214 days.

(21) Appl. No.: 10/020,604

(22) Filed: Dec. 14, 2001

(65) Prior Publication Data

US 2002/0081792 A1 Jun. 27, 2002

Related U.S. Application Data

(60) Provisional application No. 60/257,708, filed on Dec. 22, 2000.

(51) Int. Cl.$^7$ .................. H01L 27/108; H01L 29/76; H01L 29/94; H01L 21/336; H01L 21/331
(52) U.S. Cl. .................. 257/300; 257/327; 257/346; 257/406; 257/408; 257/411; 438/258; 438/300
(58) Field of Search .................. 438/291, 301, 438/350, 638, 643, 653; 257/406, 408, 411, 300, 327, 346

(56) References Cited

U.S. PATENT DOCUMENTS

| | | | | |
|---|---|---|---|---|
| 4,755,480 A | * | 7/1988 | Yau et al. | 437/47 |
| 5,196,357 A | * | 3/1993 | Boardman et al. | 437/40 |
| 5,231,038 A | * | 7/1993 | Yamaguchi et al. | 437/40 |
| 5,418,391 A | * | 5/1995 | Huang | 257/336 |
| 5,472,897 A | * | 12/1995 | Hsu et al. | 437/44 |
| 5,496,746 A | * | 3/1996 | Matthews et al. | 437/31 |
| 5,970,352 A | * | 10/1999 | Shiozawa et al. | 438/300 |
| 6,031,256 A | * | 2/2000 | Llu et al. | 257/198 |
| 6,049,098 A | * | 4/2000 | Sato | 257/198 |
| 6,072,216 A | * | 6/2000 | Williams et al. | 257/339 |
| 6,096,590 A | * | 8/2000 | Chan et al. | 438/233 |
| 6,174,754 B1 | * | 1/2001 | Lee et al. | 438/142 |
| 6,204,138 B1 | * | 3/2001 | Krishnan et al. | 438/307 |
| 6,252,277 B1 | * | 6/2001 | Chan et al. | 257/330 |
| 6,337,494 B1 | * | 1/2002 | Ryum et al. | 257/197 |
| 6,355,556 B1 | * | 3/2002 | Tseng | 438/638 |
| 6,362,065 B1 | * | 3/2002 | Swanson et al. | 438/344 |
| 6,392,271 B1 | * | 5/2002 | Alavi et al. | 257/328 |
| 2002/0034853 A1 | * | 3/2002 | Alavi et al. | 438/283 |
| 2002/0063299 A1 | * | 5/2002 | Kamata et al. | 257/408 |

* cited by examiner

Primary Examiner—Wael Fahmy
Assistant Examiner—Shrinivas H. Rao
(74) Attorney, Agent, or Firm—Peter K. McLarty; W. James Brady, III; Frederick J. Telecky, Jr.

(57) ABSTRACT

A semiconductor device (100) and a method for constructing a semiconductor device (100) are disclosed. A trench isolation structure (112) and an active region (110) are formed proximate an outer surface of a semiconductor layer (108). An epitaxial layer (111) is deposited outwardly from the trench isolation structure (112). A first insulator layer (116) and a second insulator layer (118) are grown proximate to the epitaxial layer (111). A gate stack (123) that includes portions of the first insulator layer (116 and the second insulator layer (118) is formed outwardly from the epitaxial layer (111). The gate stack (123) also includes a gate (122) with a narrow region (130) and a wide region (132) formed proximate the second insulator layer (118. The epitaxial layer (111) is heated to a temperature sufficient to allow for the epitaxial layer (111) to form a source/drain implant region (126) in the active region (110).

7 Claims, 2 Drawing Sheets

METHOD FOR CONSTRUCTING A METAL OXIDE SEMICONDUCTOR FIELD EFFECT TRANSISTOR

This application claims priority under 35 USC §119(e)(1) of provisional application Serial No. 60/257,708, filed Dec. 22, 2000.

TECHNICAL FIELD OF THE INVENTION

This invention relates generally to the field of semiconductor devices and more specifically to a method for constructing a metal oxide semiconductor field effect transistor.

BACKGROUND OF THE INVENTION

Metal oxide semiconductor field effect transistors (MOSFETs) often experience parasitic capacitance that may degrade the performance of the transistor. The source and drain of a transistor are typically adjacent to the transistor substrate. The interface between the source and drain regions and the substrate, however, often form depletion zones that result in parasitic capacitance. Known methods of reducing this form of parasitic capacitance call for using an implantation process to widen the transistor channel or for reducing the size of the source and/or drain regions. These known methods, however, do not satisfactorily reduce parasitic capacitance.

SUMMARY OF THE INVENTION

While known approaches have provided improvements over prior approaches, the challenges in the field of semiconductor devices have continued to increase with demands for more and better techniques having greater effectiveness. Therefore, a need has arisen for a new method for constructing a metal oxide semiconductor field effect transistor.

In accordance with the present invention, a method for constructing a metal oxide semiconductor field effect transistor is provided that substantially eliminates or reduces the disadvantages and problems associated with previously developed methods.

According to one embodiment of the present invention, a semiconductor device and a method for constructing a semiconductor device are disclosed. A trench isolation structure and an active region are formed proximate an outer surface of a semiconductor layer. An epitaxial layer is deposited outwardly from the trench isolation structure. A first insulator layer is grown outwardly from the epitaxial layer. A second insulator layer is grown outwardly from the first insulator layer. A gate stack is formed outwardly from the epitaxial layer. The gate stack comprises a portion of the first insulator layer, a portion of the second insulator layer, and a gate formed proximate the second insulator layer, where the gate has a narrow region and a wide region. The epitaxial layer is heated to a temperature sufficient to allow for the epitaxial layer to form a source/drain implant region in the active region.

Embodiments of the invention may provide numerous technical advantages. A technical advantage of one embodiment is that trench isolation regions comprising an insulative material isolate epitaxial source/drain regions of a transistor from the substrate of the transistor. This configuration reduces parasitic capacitance from the epitaxial source/drain regions to the substrate, thus improving the performance of the transistor. A technical advantage of another embodiment is that the trench isolation regions may prevent cosmic or ionizing high energy particles from penetrating the source/drain active regions to the substrate, thus making the semiconductor device less susceptible to single event upsets.

A technical advantage of another embodiment is that formation of source/drain implant regions may be performed at the same time as the formation of the transistor gate. A technical advantage of another embodiment is that a gate stack has a first insulator layer comprising silicon dioxide and a second insulator layer comprising silicon nitride, which allows for controlled formation of a gate region for the transistor gate. A technical advantage of another embodiment is that a gate has a wide region and a narrow region. The narrow region may provide for a better channel between epitaxial source/drain regions, whereas the wide region may reduce the resistance of the gate.

Other technical advantages are readily apparent to one skilled in the art from the following figures, descriptions, and claims.

BRIEF DESCRIPTION OF THE DRAWINGS

For a more complete understanding of the present invention and for further features and advantages, reference is now made to the following description, taken in conjunction with the accompanying drawings, in which.

DETAILED DESCRIPTION OF THE DRAWINGS

Embodiments of the present invention and its advantages are best understood by referring to FIGS. 1 through 6 of the drawings, like numerals being used for like and corresponding parts of the various drawings.

FIGS. 1 through 6 are a series of cross-sectional views illustrating stages of constructing a transistor of a semiconductor device 100 in accordance with the present invention.

Figure 1:
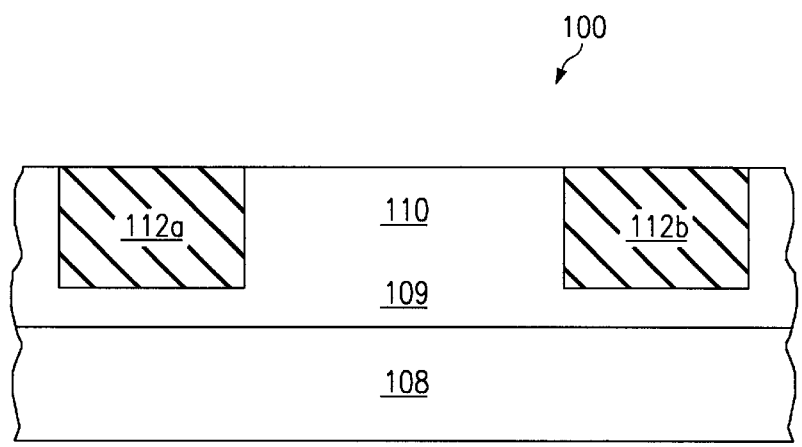
FIG. 1 illustrates an active region and trench isolation structures formed outwardly from an inner substrate of a transistor according to one embodiment of the present invention.

FIG. 1 illustrates an active region 110 and trench isolation structures 112 formed outwardly from an inner substrate 108. Inner substrate 108 may comprise a suitable semiconductive material such as silicon or silicon germanium, which may be used for a strained silicon or silicon germanium MOSFET, having a suitable thickness, for example, approximately 300 microns. An outer substrate 109 grown outwardly from inner substrate 108 may comprise a suitable semiconductive material such as silicon of a suitable thickness, for example, approximately 5,000 to 8,000 Å. Outer substrate 109 may comprise one or more doped regions formed by suitable implantation of ions such as arsenic or boron ions at an energy of approximately ten to forty KeV and a dose of 2 E 14 to 5 E 15 ion-cm$^{-2}$.

Inner substrate 108 and outer substrate 109, however, may comprise any suitable substrate structure, for example, a silicon-on-insulator (SOI), silicon-on-safire (SOS), or silicon-on-anything (SOA) substrate structure. Additionally, outer substrate 109 may have any suitable thickness, for example, 100 to 2,000 Å for a thin film SOI substrate structure.

Active region 110 may be defined from outer substrate 109 using suitable patterning processes such as photolithographic definition and etching. Trench isolation structures 112 may be formed from trenches having a depth of approximately 3,000 to 5,000 Å defined from the outer surface of outer substrate 109. The trenches, however, may have any suitable depth, for example, 500 to 2,000 Å for thin film SOI substrate structures. The trenches may be defined using suitable patterning processes such as photolithographic definition and etching, and-may-be defined such that outer substrate 109 disposed between inner substrate 108 and trench isolation structures 112 has a thickness of approximately 2,000 Å. Trench isolation structures 112 may comprise insulative material such as silicon dioxide, silicon nitride, intrinsic polysilicon, or any combination thereof. The surface may be planarized by a suitable planarization process such as a chemical mechanical polish process to define active region 110 and trench isolation structures 112.

Active regions 110 may comprise one or more doped regions formed by suitable implantation of ions such as phosphorus or boron ions at an energy of approximately twenty KeV to one MeV and a dose of 1 E 12 to 1 E 14 ion-cm$^{-2}$.

Trench isolation structures 112 isolate active region 110 from other active regions of semiconductor device 100, allowing the active regions to function properly. Additionally, trench isolation structures 112 may prevent cosmic particles from forming a conductive charge path between a source/drain active region and inner substrate 108, thus making semiconductor device 100 less susceptible to single event upsets.

Figure 2:
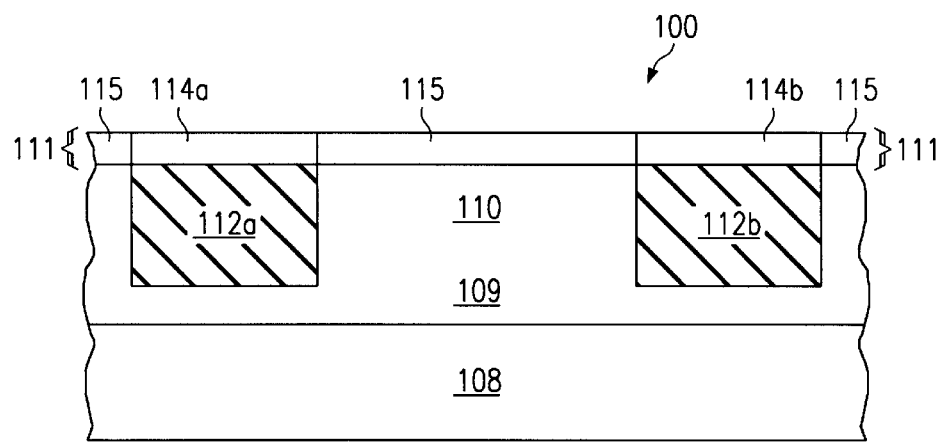
FIG. 2 illustrates an epitaxial layer formed outwardly from the active region and the trench isolation structures.

FIG. 2 illustrates an epitaxial layer 111 formed outwardly from active region 110 and trench isolation structures 112. Epitaxial layer 111 may comprise a suitable semiconductive material such as silicon, silicon germanium ($Si_xGe_{1-x}$), or silicon germanium carbon ($Si_xGe_{1-x-y}C_y$) having a suitable thickness, for example, approximately 1,000 Å to 3,000 Å such as 2,000 Å, deposited outwardly from active region 110 and trench isolation structures 112. Epitaxial layer 111 comprises epitaxial source/drain regions 114 formed outwardly from trench isolation structures 112 and a channel region 115 formed outwardly from active region 110.

Epitaxial source/drain regions 114 may comprise polycrystalline silicon, and channel region 115 may comprise single crystalline silicon or silicon germanium, or strained silicon, silicon germanium, or silicon germanium carbon. The insulative material of trench isolation structures 112 insulates epitaxial source/drain regions 114 from outer substrate 109, which reduces parasitic capacitance from epitaxial source/drain regions 114 to outer substrate 109, thus improving the performance of the transistor.

Epitaxial layer 111 may comprise one or more doped regions formed through suitable implantation of ions, for example, boron, arsenic, or phosphorus ions at an energy of twenty to thirty KeV and a dose of 2 E 14 to 2 E 15 ion-cm$^2$. An annealing process may be performed to reduce transient enhanced diffusion. The anneal process may be performed at a temperature between approximately 1000° C. and 1050° C. for a time of approximately five to thirty seconds.

Figure 3:
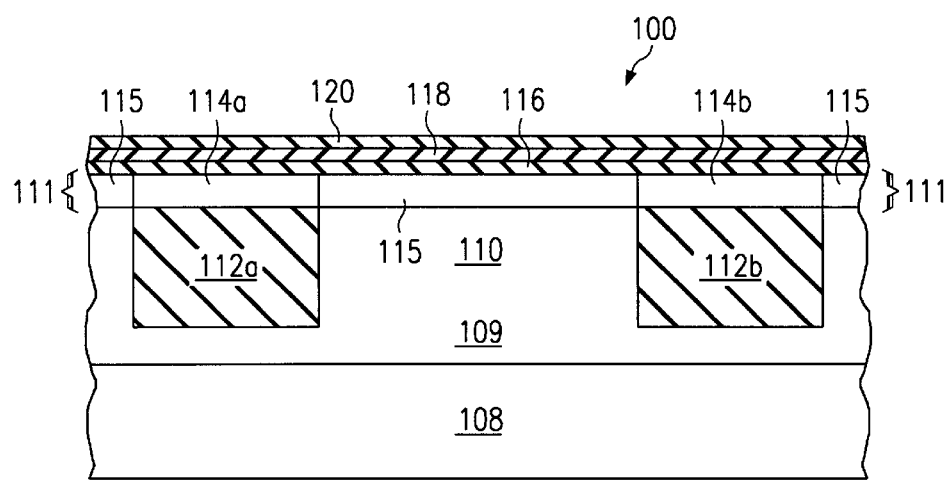
FIG. 3 illustrates a first insulator layer formed outwardly from the epitaxial layer, a second insulator layer formed outwardly from the first insulator layer, and a third insulator layer formed outwardly from the second insulator layer.

FIG. 3 illustrates a first insulator layer 116 formed outwardly from epitaxial layer 111, a second insulator layer 118 formed outwardly from first insulator layer 116, and a third insulator layer 120 formed outwardly from second insulator layer 118. Insulator layers 116, 118, and 120 may be formed using a suitable growth or deposition process such as oxidation or nitridation.

First insulator layer 116 and third insulator layer 120 may comprise a suitable insulative material such as silicon dioxide having a thickness of approximately 20 to 200 Å. First insulator layer 116 and third insulator layer 120 may comprise a high-k dielectric material such as $Ta_2O_5$, $HfO_2$, or $ZrO_2$ or any combination of the preceding. Use of a high-k dielectric material may reduce gate resistance and minimize gate overlap capacitance, which may minimize noise in radio frequency integrated circuits. Second insulator layer 118 may comprise a suitable insulative material such as silicon nitride having a thickness of approximately 100 to 200 Å. Insulator layers 116, 118, and 120 may form a stack that is approximately 700 Å in thickness.

Figure 4:
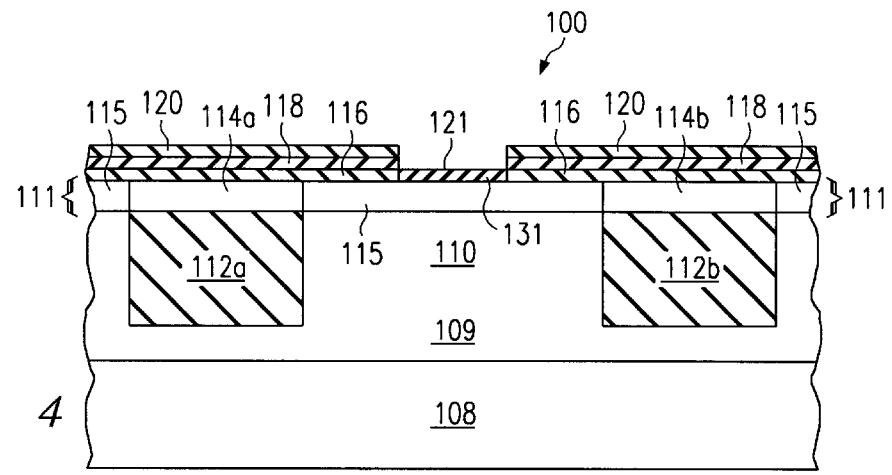
FIG. 4 illustrates a gate region formed by removing a portion of the third insulator layer and the second insulator layer.

In one embodiment, first insulator layer 116 comprises silicon dioxide and second insulator layer 118 comprises silicon nitride, which allows for controlled formation of gate region 121 (FIG. 4). Silicon nitride and silicon dioxide have different etching rates, so that dry etching through second insulator layer 118 and wet etching first insulator layer 116 may be carefully controlled using the appropriate etch chemistry.

FIG. 4 illustrates a gate region 121 formed by removing portions of third insulator layer 120, second insulator layer 118, and first insulator layer 116. Removing portions of third insulator layer 120, second insulator layer 118, and first insulator layer 116 may be accomplished by suitable patterning processes, for example, photolithographic definition and anisotropic etching. For example, second insulator layer 118 may be anisotropically dry etched, and first insulator layer 116 may be anisotropically wet etched. Gate region 121 comprises a portion of the remaining outer surface that may be used as an area of contact for a gate 122 (FIG. 5) of the transistor.

In one embodiment, a length of gate region 121 parallel to the direction of a current between epitaxial source/drain regions 114 is approximately one-tenth to two microns, and a width of gate region 121 perpendicular to the direction of a current between epitaxial source/drain regions 114 is approximately 25 to 100 microns. The width and length, however, may have any values suitable for achieving a desired power, such as approximately one-half micron in length and ten microns in width, or approximately one-quarter micron in length and seven to eight microns in width. The length and width of gate region 121 may determine a length parallel to the direction of a current between epitaxial source/drain regions 114 and a width perpendicular to the direction of the current, respectively, of a narrow region 130 of a gate 122 (FIG. 5).

A gate insulator layer 131 may comprise an insulative material such as a high quality gate silicon dioxide or a high-k dielectric material grown outwardly from gate region to a suitable thickness such as approximately 100 Å using a suitable growing process.

Figure 5:
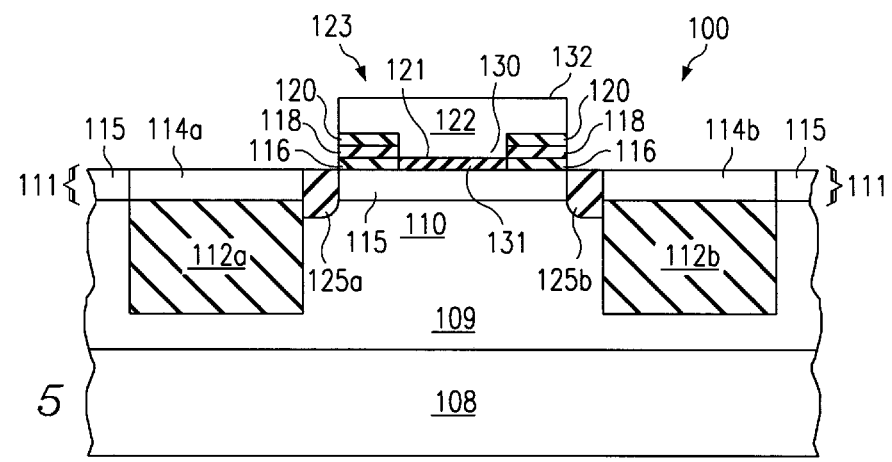
FIG. 5 illustrates a gate stack formed outwardly from the epitaxial layer.

FIG. 5 illustrates a gate stack 123 formed outwardly from epitaxial layer 111. Gate stack 123 comprises gate 122, gate insulator layer 131, and first, second and third insulator layers 116, 118 and 120, respectively. Gate 122 may be defined by patterning a layer formed outwardly from gate insulative layer 131 using suitable processes. The layer may comprise a semiconductive material such as polycrystalline silicon, germanium silicon germanium, or silicon germanium carbon having a thickness of approximately 2,000 Å. The layer may also comprise one or more doped regions formed through suitable implantation of ions, for example, boron, arsenic, or phosphorus ions at an energy of ten to thirty KeV and a dose of 2 E 14 to 2 E 15 ion-cm$^2$. Midgap gate material may be used for the gate contact region.

The layer may be patterned to form gate 122 using suitable patterning processes such as photolithographic definition and anisotropic etching. Gate 122 may comprise a narrow region 130 formed outwardly from first insulator layer 116 and a wide region 132 formed outwardly from narrow region 130 and third insulator layer 120. Narrow region 130 may provide for better control of the channel between epitaxial source/drain regions 114, whereas wide region 132 may reduce the resistance of gate 122.

The length and width of narrow region 130 of gate 122 may be approximately equal to the length and width of gate region 121. For example, the length of narrow region 130 may be approximately one-tenth to two microns, and the width may be approximately 25 to 100 microns. The length and width, however, may have any values suitable for achieving a desired power, such as approximately one-half micron in length and ten microns in width, or approximately one-quarter micron in length and seven to eight microns in width. Gate 122 may be formed such that an end of wide region 132 overlaps third insulator layer 120 approximately one-tenth to one micron, and the length of wide region 132 is approximately two-tenths to two microns greater than the length of narrow region 130. Salicidation may be performed to reduce gate resistance.

An annealing process may be performed on semiconductor device 100 to diffuse dopants away from gate region 121 to avoid peaking at gate region 121. Lightly doped drain regions 125 may be implanted in active region 115 through suitable implantation of ions, for example, boron, arsenic, or phosphorus ions at an energy of twenty to eighty KeV and a dose of 1 E 13 to 2 E 13 ion-cm$^2$. Lightly doped drain regions 125 may be implanted to improve the breakdown voltage at source/drain implant regions 126 (FIG. 6).

Figure 6:
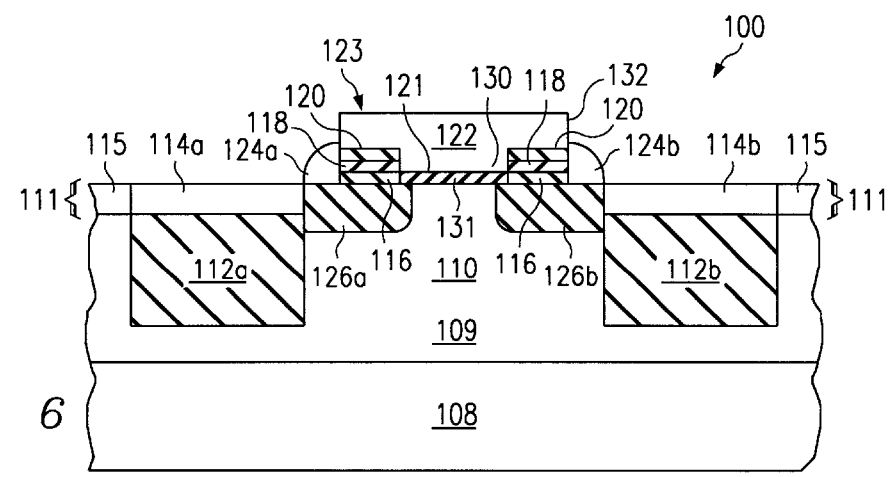
FIG. 6 illustrates sidewall insulator bodies and source drain implant regions formed outwardly from the gate stack and the epitaxial layer.

FIG. 6 illustrates sidewall insulator bodies 124 and source/drain implant regions 126, the formation of which substantially completes the transistor. Sidewall insulator bodies 124 may be formed by patterning and anisotropically etching one or more insulator layers deposited outwardly from epitaxial layer 111 and gate stack 123 using suitable deposition processes. Insulator layers may comprise silicon dioxide or silicon nitride. The stack of insulator layers may have a thickness of approximately 200 to 2000 Å.

Source drain implant regions 126 are formed using a suitable anneal process resulting in epitaxial source/drain regions 114 moving towards gate 122. For example, the anneal process may be performed by heating semiconductor device 100 to a temperature between approximately 900° C. and 1050° C. for a time between approximately 10 and 30 seconds. Source drain implant regions 126 may be heavily doped, or one region 126 may be heavily doped and the other region 126 lightly doped to create an asymmetrical power metal oxide semiconductor field effect transistor.

The semiconductive material of epitaxial source/drain regions 114 spreads the dopants substantially uniformly at a relatively low temperature. Accordingly, formation of source/drain implant regions 126 may be performed at substantially the same time as formation of gate 122 during an annealing process.

Embodiments of the invention may provide numerous technical advantages. A technical advantage of one embodiment is that trench isolation regions 112 comprising an insulative material isolate epitaxial source/drain regions 114 of a transistor from outer substrate 109 of the transistor. This configuration reduces parasitic capacitance from epitaxial source/drain regions 114 to outer substrate 109, thus improving the performance of the transistor. A technical advantage of another embodiment is that the trench isolation regions 112 may prevent cosmic or ionizing high energy particles from penetrating source/drain regions 114 to outer substrate 109, thus making the semiconductor device 100 less susceptible to single event upsets.

A technical advantage of another embodiment is that formation of source/drain implant regions 126 may be performed at the same time as the formation of gate 122. A technical advantage of another embodiment is that gate stack 123 has first insulator layer 116 comprising silicon dioxide and second insulator layer 118 comprising silicon nitride, which allows for controlled formation of gate region 121 for gate 122. A technical advantage of another embodiment is that gate 122 has wide region 132 and narrow region 130. Narrow region 130 may provide for a better channel between epitaxial source/drain regions 114, whereas wide region 132 may reduce the resistance of gate 122.

Although an embodiment of the invention and its advantages are described in detail, a person skilled in the art could make various alterations, additions, and omissions without departing from the spirit and scope of the present invention as defined by the appended claims.

What is claimed is:

1. A semiconductor device, comprising:
    an outer surface of a semiconductor layer defining a trench isolation structure and an active region;
    an epitaxial layer deposited outwardly from he trench isolation structure;
    a first insulator layer grown outwardly from he epitaxial layer;
    a second insulator layer grown outwardly from the first insulator layer;
    a third insulator grown outwardly from the second insulator;
    a gate stack formed outwardly from the epitaxial layer, the gate stack comprising a portion of the first insulator layer, a portion of the econd insulator layer, a portion of the third insulator, and a gate formed proximate the third insulator layer, the gate having a narrow region and a wide region; and
    a source/drain implant region in the active region formed by heating the epitaxial layer to a temperature sufficient to allow for the epitaxial layer to form the source/drain implant region.

2. The semiconductor device of claim 1, wherein the epitaxial layer has a thickness of 1,000 angstroms to 3,000 angstroms.

3. The semiconductor device of claim 1, wherein the epitaxial layer comprises silicon germanium carbon.

4. The semiconductor device of claim 1, wherein the gate stack comprises a third insulator layer formed outwardly from the second insulator layer, the third insulator layer comprising silicon dioxide.

5. The semiconductor device of claim wherein:
    a length of the narrow region of the gate is one-tenth microns to two microns; and
    a width of the narrow region of the gate is 25 microns to 100 microns.

6. The semiconductor device of claim 1, wherein a length of the wide region of the gate is two-tenths microns to two icrons greater than a length of the narrow region of the gate.

7. A semiconductor device, comprising:
- an outer surface of a semiconductor layer forming a trench isolation structure and an active region, the trench isolation structure comprising silicon dioxide;
- an epitaxial layer comprising silicon of a thickness of approximately 1,000 angstroms to 3,000 angstroms deposited outwardly from the trench isolation structure;
- a first insulator layer comprising silicon dioxide grown outwardly from the epitaxial layer;
- a second insulator layer comprising silicon nitride grown outwardly from the first insulator layer;
- a third insulator layer comprising silicon dioxide formed outwardly from the second insulator layer;
- a gate stack formed outwardly from the epitaxial layer, the gate stack comprising a portion of the first insulator layer, a portion of the second insulator layer, a portion of the third insulator layer, and a gate formed proximate the third insulator layer, the gate having a narrow region and a wide region, a length of the narrow region of the gate approximately one-tenth microns to two microns, a width of the narrow region of the gate approximately 25 microns to 100 microns, a length of the wide region of the gate approximately two-tenths microns to two microns greater than a length of the narrow region of the gate; and
- a source/drain implant region in the active region formed by heating the epitaxial layer to a temperature sufficient to allow for the epitaxial layer to form the source/drain implant region.

* * * * *